United States Patent
Tan et al.

(10) Patent No.: US 9,336,345 B2
(45) Date of Patent: May 10, 2016

(54) METHODS FOR CONVERTING PLANAR DESIGNS TO FINFET DESIGNS IN THE DESIGN AND FABRICATION OF INTEGRATED CIRCUITS

(71) Applicant: GLOBALFOUNDRIES Singapore Pte. Ltd.

(72) Inventors: Soon Yoeng Tan, Singapore (SG); Srinidhi Ramamoorthy, Singapore (SG); Angeline Ho Chye Ee, Singapore (SG); Andreas Knorr, Singapore (SG); Frank Scott Johnson, Saratoga Spring, NY (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 252 days.

(21) Appl. No.: 14/040,037

(22) Filed: Sep. 27, 2013

(65) Prior Publication Data

US 2015/0093910 A1 Apr. 2, 2015

(51) Int. Cl.
  *G06F 17/50* (2006.01)
  *H01L 21/033* (2006.01)
  *H01L 21/8234* (2006.01)
  *H01L 27/02* (2006.01)

(52) U.S. Cl.
  CPC ........ *G06F 17/5072* (2013.01); *H01L 21/0332* (2013.01); *H01L 21/823431* (2013.01); *H01L 27/0207* (2013.01)

(58) Field of Classification Search
  USPC ........................................................ 716/119
  See application file for complete search history.

(56) References Cited

U.S. PATENT DOCUMENTS

| 8,533,651 | B1* | 9/2013 | Tan | G06F 17/5072 716/103 |
| 2011/0283245 | A1* | 11/2011 | Shen | H01L 27/0207 716/106 |
| 2012/0273899 | A1* | 11/2012 | Wann | G06F 17/5068 257/401 |
| 2012/0280331 | A1* | 11/2012 | Ou | H01L 21/823431 257/401 |

FOREIGN PATENT DOCUMENTS

EP   0 072 674 B1   2/1989

\* cited by examiner

*Primary Examiner* — Mohammed Alam
(74) *Attorney, Agent, or Firm* — Ingrassia Fisher & Lorenz, P.C.

(57) ABSTRACT

Methods for converting planar designs to FinFET designs in the design and fabrication of integrated circuits are provided. In one embodiment, a method for converting a planar integrated circuit design to a non-planar integrated circuit design includes identifying a rectangular silicon active area in the planar integrated circuit design, superimposing a FinFET design grid comprising a plurality of equidistantly-spaced parallel grid lines over the rectangular silicon active area such that two sides of the rectangular silicon active area are parallel to the grid lines, and generating a rectangular active silicon marker area encompassing the silicon active area. Furthermore, the method includes generating fin mandrels longitudinally along every other grid line of the plurality of grid lines and within the active silicon marker area and the silicon active area, and removing the fin mandrels from areas of the design grid outside of the active silicon marker area.

19 Claims, 9 Drawing Sheets

METHODS FOR CONVERTING PLANAR DESIGNS TO FINFET DESIGNS IN THE DESIGN AND FABRICATION OF INTEGRATED CIRCUITS

TECHNICAL FIELD

Embodiments of the present disclosure are generally directed to integrated circuits and methods for designing and fabricating integrated circuits. More particularly, the present disclosure is directed to methods for converting planar designs to FinFET designs in the design and fabrication of integrated circuits.

BACKGROUND

Many present day integrated circuits (ICs) are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions, defining a transistor channel, between which a current may flow. A control voltage applied to the gate electrode controls the flow of current through the channel between the source and drain electrodes. Complementary MOS (CMOS) devices include a plurality of N-channel MOS (NMOS) transistors and a plurality of P-channel (PMOS) transistors. During the fabrication of complex integrated circuits using, for instance, MOS technology, millions of transistors, e.g., NMOS transistors and/or PMOS transistors, are formed on a substrate including a crystalline semiconductor layer.

In contrast to traditional planar MOS transistors, which are fabricated using conventional lithographic fabrication methods, nonplanar MOSFETs incorporate various vertical transistor structures. One such semiconductor structure is the "FinFET," which takes its name from the multiple thin silicon "fins" that are used to form the respective gate channels, and which are often on the order of tens of nanometers in width. In the rapidly-advancing semiconductor manufacturing industry, CMOS FinFET devices are increasingly used in many logic and other applications and are integrated into various different types of semiconductor devices. FinFET devices often include semiconductor fins with high aspect ratios in which the channel and source/drain regions for the transistor are formed. A gate is formed over and along the sides of a portion of the semiconductor fins. The use of fins increases surface areas of the channel and source/drain regions for the same area. The increased surface area in a FinFET results in faster, more reliable, and better-controlled semiconductor transistor devices that consume less power than planar devices configured to perform the same function.

For example, in low-power devices, the advantages of the FinFET architecture become more significant as the operating voltage is reduced. At 1V, the FinFET is 18% faster than the equivalent planar device, but at 0.7V, the advantage is 37%. This is because the FinFET's sub-threshold swing (the amount that the threshold voltage has to be changed to halve its leakage) is lower than in a planar device, so the device can be operated at lower threshold voltages for the same leakage. This, in turn, means that the difference between the gate and threshold voltage at very low operating voltages is much greater, exaggerating the performance advantage of very low-voltage FinFETs.

As manufacturing process progresses into smaller and smaller technology nodes, devices originally designed in a larger technology node may benefit from manufacturing in a smaller technology node in ways such as increased performance, efficiency, and decreased die size. Similarly, devices designed using planar transistors may also benefit from manufacturing using FinFETs. However, because different design rules apply to planar structure layouts and FinFET structure layouts, converting portions of the device from a planar layout to a FinFET layout by hand may be akin to creating a new design from scratch and is a highly resource intensive (in both computation and human capital) process. For product already being manufactured using planar transistors, a conversion that includes changes to semiconductor layers above the transistor level would require many new photomasks to be created, which dramatically increases the cost required to fabricate the integrated circuit.

While some methods are currently known in the art for the conversion of planar designs to FinFET designs, these methods suffer from several drawbacks. For instance, may conversion methods currently known are implemented at the reticle level, i.e., at the overall top level of the integrated circuit design. At the reticle level, verification of the functionality of the FinFET conversion is very difficult, due both to the fact that verification occurs late in the design flow, and the fact that verification at the reticle level requires data for the entire reticle, which takes a significant amount of computational time to process.

Accordingly, it is desirable to provide improved methods for converting planar integrated circuit designs to FinFET integrated circuit designs. Additionally, it is desirable to provide such methods that reduce the computational resources required to convert planar designs to FinFET designs. Furthermore, other desirable features and characteristics of the present disclosure will become apparent from the subsequent detailed description and the appended claims, taken in conjunction with the accompanying drawings and this background of this disclosure.

BRIEF SUMMARY

Methods for converting planar designs to FinFET designs in the design and fabrication of integrated circuits are provided. In one embodiment, a method for converting a planar integrated circuit design to a non-planar integrated circuit design includes identifying a rectangular silicon active area in the planar integrated circuit design, superimposing a FinFET design grid comprising a plurality of equidistantly-spaced parallel grid lines over the rectangular silicon active area such that two sides of the rectangular silicon active area are parallel to the grid lines, and generating a rectangular active silicon marker area encompassing the silicon active area. Furthermore, the method includes generating fin mandrels longitudinally along every other grid line of the plurality of grid lines and within the active silicon marker area and the silicon active area, and removing the fin mandrels from areas of the design grid outside of the active silicon marker area. The method may be implemented on a computer processor of a computing system.

In another embodiment, a method of fabricating an integrated circuit includes identifying a rectangular silicon active area in the planar integrated circuit design, superimposing a FinFET design grid comprising a plurality of equidistantly-spaced parallel grid lines over the rectangular silicon active area such that two sides of the rectangular silicon active area are parallel to the grid lines, and generating a rectangular active silicon marker area encompassing the silicon active area. Furthermore, the method includes generating fin mandrels longitudinally along every other grid line of the plurality of grid lines and within the active silicon marker area and the silicon active area, and removing the fin mandrels from areas of the design grid outside of the active silicon marker area. Still further, the method includes generating a photolithographic mask based on the non-planar integrated circuit design and forming a non-planar integrated circuit in a semiconductor substrate by exposing a light source through the photolithographic mask and onto the semiconductor substrate.

BRIEF DESCRIPTION OF THE DRAWINGS

The present disclosure will hereinafter be described in conjunction with the following drawing figures, wherein like numerals denote like elements, and wherein.

DETAILED DESCRIPTION

Figure 1:
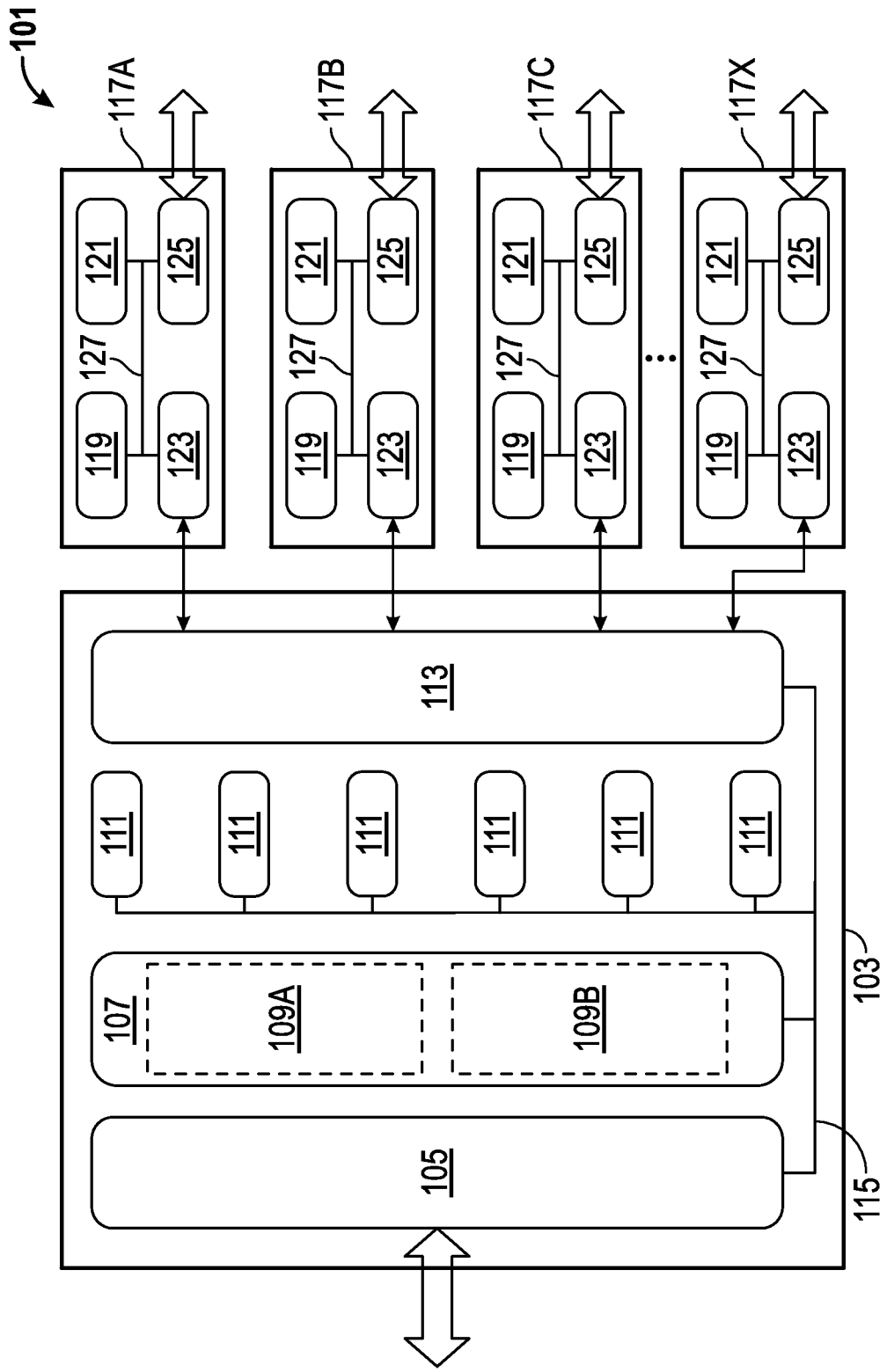
FIG. 1 illustrates an exemplary computing system that may be used to implement various embodiments of the invention.

The following detailed description is merely exemplary in nature and is not intended to limit the embodiments set forth herein or the application and uses of the embodiments. Furthermore, there is no intention to be bound by any theory presented in the preceding background or the following detailed description.

Embodiments of the present disclosure are generally directed to methods for converting planar designs to FinFET designs in the design and fabrication of integrated circuits. In broad terms, the methods described herein are performed on individual "macro cells" of planar integrated circuit designs. The term "macro cell" refers to a grouping of circuit elements (transistors, resistors, etc., which are drawn in a generally rectangular shape) that perform a single logic function, for example AND, OR, NOR, and XOR, and others as are known in the art. There may be many macro cells in a given reticle level design. Each macro cell of a planar circuit design includes various rectangularly-shaped active silicon ("RX") areas. A FinFET design "grid," including a plurality of equally-spaced parallel lines, is superimposed over the RX rectangles in a manner such that the parallel lines of the grid are parallel to two of the sides of the RX areas. Thereafter, a plurality of rectangularly-shaped "marker areas" are drawn around the RX rectangles such that two sides of each marker rectangle are coincident with (i.e., drawn over) two of the grid lines. Each marker rectangle may include a plurality of RX area rectangles drawn therein. With the grid superimposed, the two sides of each RX rectangle that are parallel to the grid lines are inwardly "cropped" (that is, the size of the RX rectangle is reduced by moving the two sides inward toward one another) such that the two sides are re-drawn over two of the grid lines, in particularly the two closest parallel lines inward from the two sides of the originally-drawn rectangle. In this manner, the RX areas become "gridded" to (i.e., have two of their sides re-drawn so as to coincide with) the FinFET design grid. Thereafter, fin mandrels are superimposed over the alternating grid lines of the FinFET design grid, and fin mandrels that lie outside of the RX areas are removed. The FinFET designs generated in accordance with the foregoing planar-to-FinFET design conversion methods may be input to a suitable integrated circuit fabrication process for fabricating an integrated circuit in accordance with the FinFET designs. In this manner, conversion of the planar design can be performed at the macro cell level, as opposed to the reticle level, thus allowing verification of the design early on in the design process flow, and significantly reducing the amount of data needed to be processed for verification.

The methods for converting planar designs to FinFET designs, in an exemplary embodiment, may be implemented using computer-executable software instructions executed by one or more programmable computing devices. Because these exemplary embodiments may be implemented using software instructions, the components and operation of a generic programmable computer system on which various embodiments may be employed will first be described. Further, because of the complexity of some mask design processes and the large size of many circuit designs, various electronic design tools are configured to operate on a computing system capable of simultaneously running multiple processing threads. The components and operation of a computer network having a host or master computer and one or more remote or slave computers therefore will be described with reference to FIG. 1. This operating environment is only one example of a suitable operating environment, however, and is not intended to suggest any limitation as to the scope of use or functionality of the described embodiments.

In FIG. 1, a computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, non-transitory media such as microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more mask design operations according to various exemplary embodiments. Accordingly, the memory 107 stores software instructions 109A that, when executed, will implement a software application for performing one or more such operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
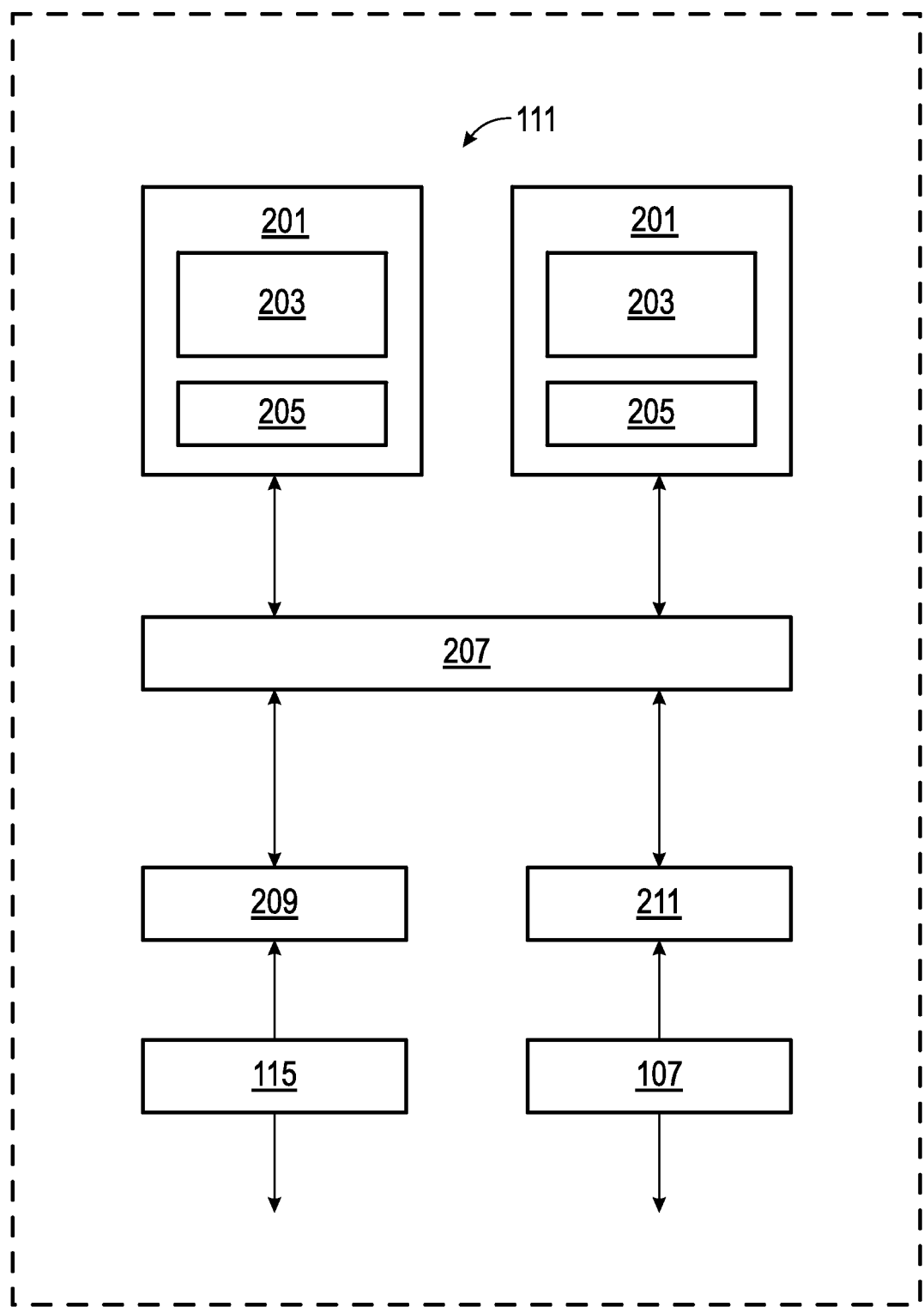
FIG. 2 illustrates an exemplary multi-core processor unit associated with the computing system shown in FIG. 1 that may be used to implement various embodiments of the invention.

In some embodiments, the master computing device 103 may employ one or more processing units 111 having more than one processor core. Accordingly, FIG. 2 illustrates an example of a multi-core processor unit 111 that may be employed with various embodiments. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR, and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. The processor cores 201 communicate through the interconnect 207 with input/output interfaces 209 and a memory controller 211. The input/output interface 209 provides a communication interface between the processor unit 201 and the bus 115. Similarly, the memory controller 211 controls the exchange of information between the processor unit 201 and the system memory 107. In some embodiments, the processor units 201 may include additional components, such as a high-level cache memory accessible shared by the processor cores 201.

While FIG. 2 shows one illustration of a processor unit 201 that may be employed by some embodiments, it should be appreciated that this illustration is representative only, and is not intended to be limiting. For example, some embodiments may employ a master computer 103 with one or more cell processors. The cell processor employs multiple input/output interfaces 209 and multiple memory controllers 211. Also, the cell processor has nine different processor cores 201 of different types. More particularly, it has six or more synergistic processor elements (SPEs) and a power processor element (PPE). Each synergistic processor element has a vector-type computing engine 203 with 128×128 bit registers, four single-precision floating point computational units, four integer computational units, and a 256 KB local store memory that stores both instructions and data. The power processor element then controls the tasks performed by the synergistic processor elements. Because of its configuration, the cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the slave computers 117A, 117B, 117C . . . 117X through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the slave computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 117 may include a memory 119, a processor unit 121, an interface device 123, and, optionally, one more input/output devices 125 connected together by a system bus 127. As with the master computer 103, the optional input/output devices 125 for the slave computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a cell processor. The memory 119 then may be implemented using any combination of the computer readable media discussed above. Like the interface device 113, the interface devices 123 allow the slave computers 117 to communicate with the master computer 103 over the communication interface.

In the illustrated example, the master computer 103 is a multi-processor unit computer with multiple processor units 111, while each slave computer 117 has a single processor unit 121. It should be noted, however, that alternate embodiments may employ a master computer having single processor unit 111. Further, one or more of the slave computers 117 may have multiple processor units 121, depending upon their intended use, as previously discussed. Also, while only a single interface device 113 or 123 is illustrated for both the master computer 103 and the slave computers, it should be noted that, with alternate embodiments, either the computer 103, one or more of the slave computers 117, or some combination of both may use two or more different interface devices 113 or 123 for communicating over multiple communication interfaces.

In some embodiments, the master computer 103 may be connected to one or more external data storage devices. These external data storage devices may be implemented using any combination of computer readable media that can be accessed by the master computer 103. The computer readable media may include, for example, non-transitory microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations, one or more of the slave computers 117 may alternately or additionally be connected to one or more external data storage devices. Often, these external data storage devices will include data storage devices that also are connected to the master computer 103, but they also may be different from any data storage devices accessible by the master computer 103.

Figure 3:
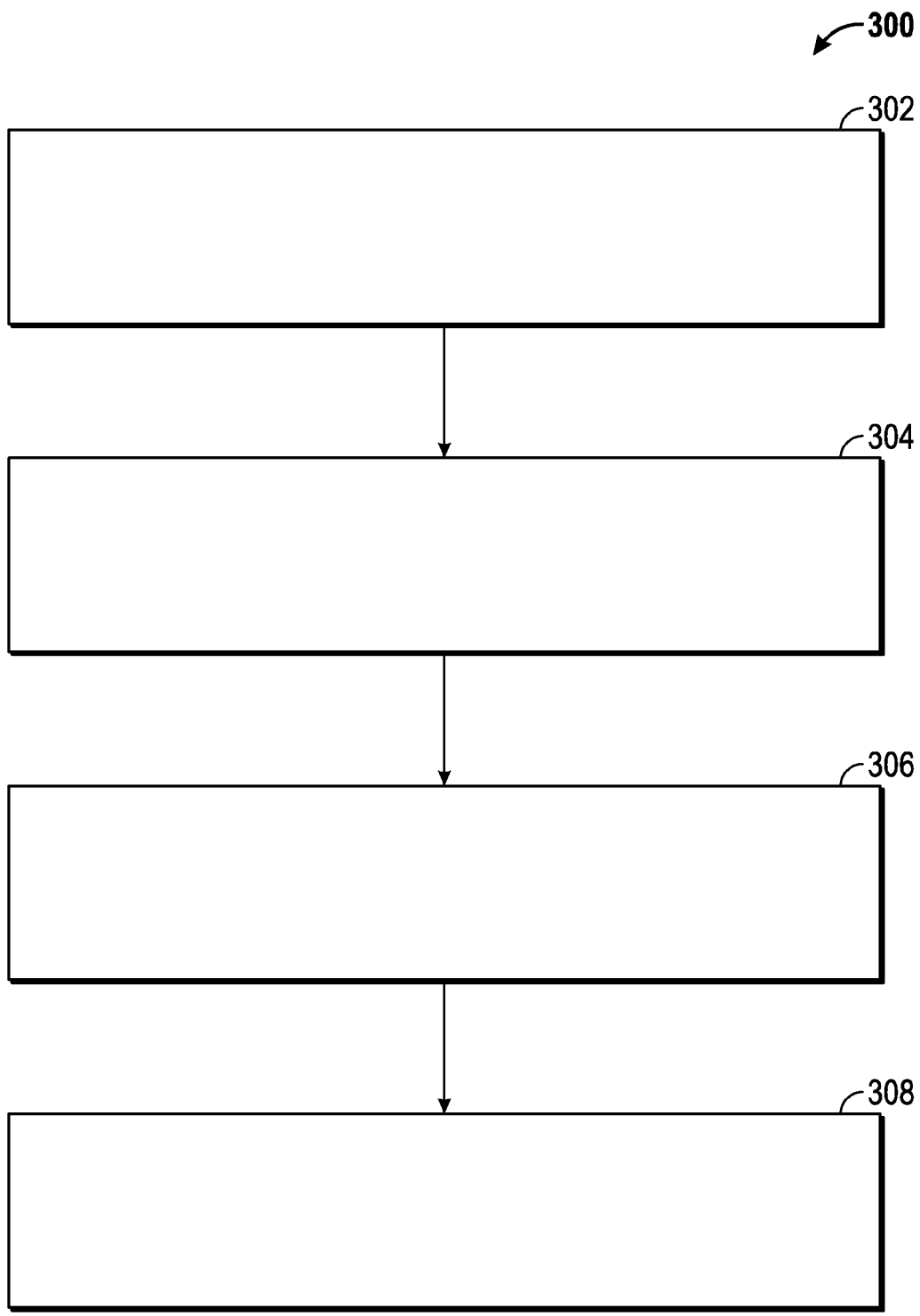
FIG. 3 is a flowchart illustrating various exemplary methods for converting planar designs to FinFET designs in the design and fabrication of integrated circuits implemented using the computing system illustrated in FIGS. 1 and 2.
Figure 4:
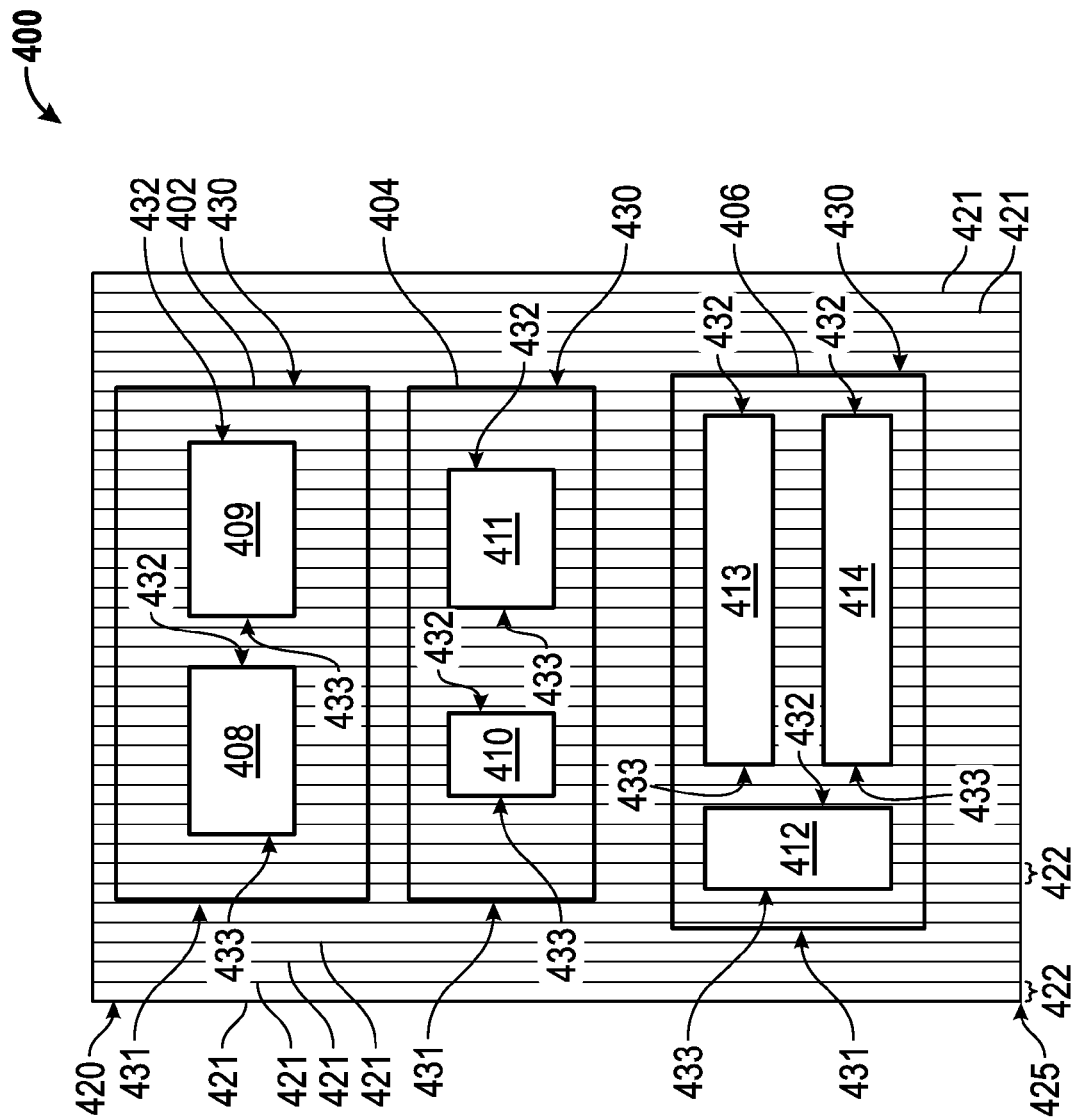
FIGS. 4-7 illustrate integrated circuit designs and methods for designing integrated circuit structures in accordance with various exemplary embodiments of the present disclosure.
Figure 5:
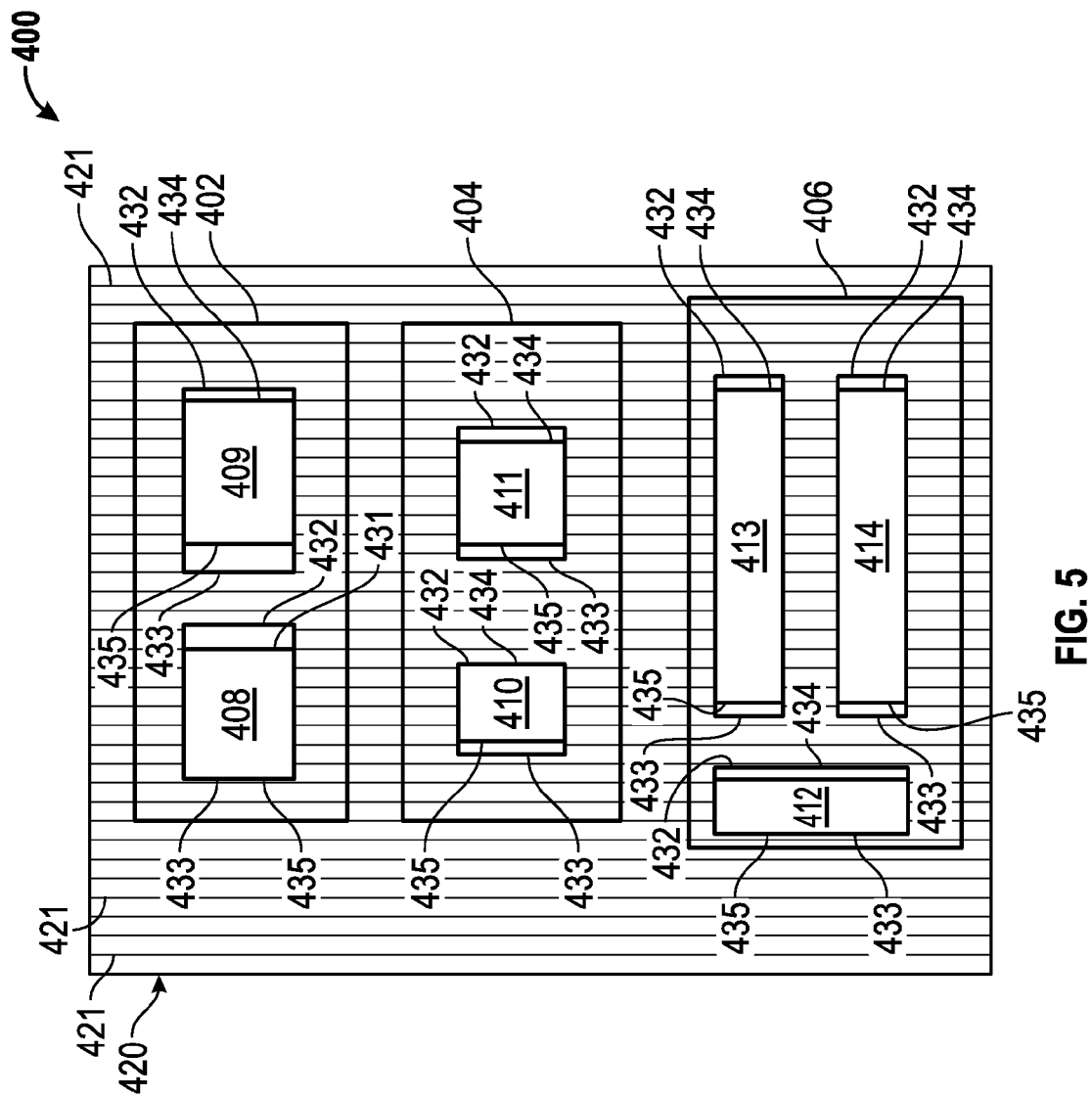
Figure 6:
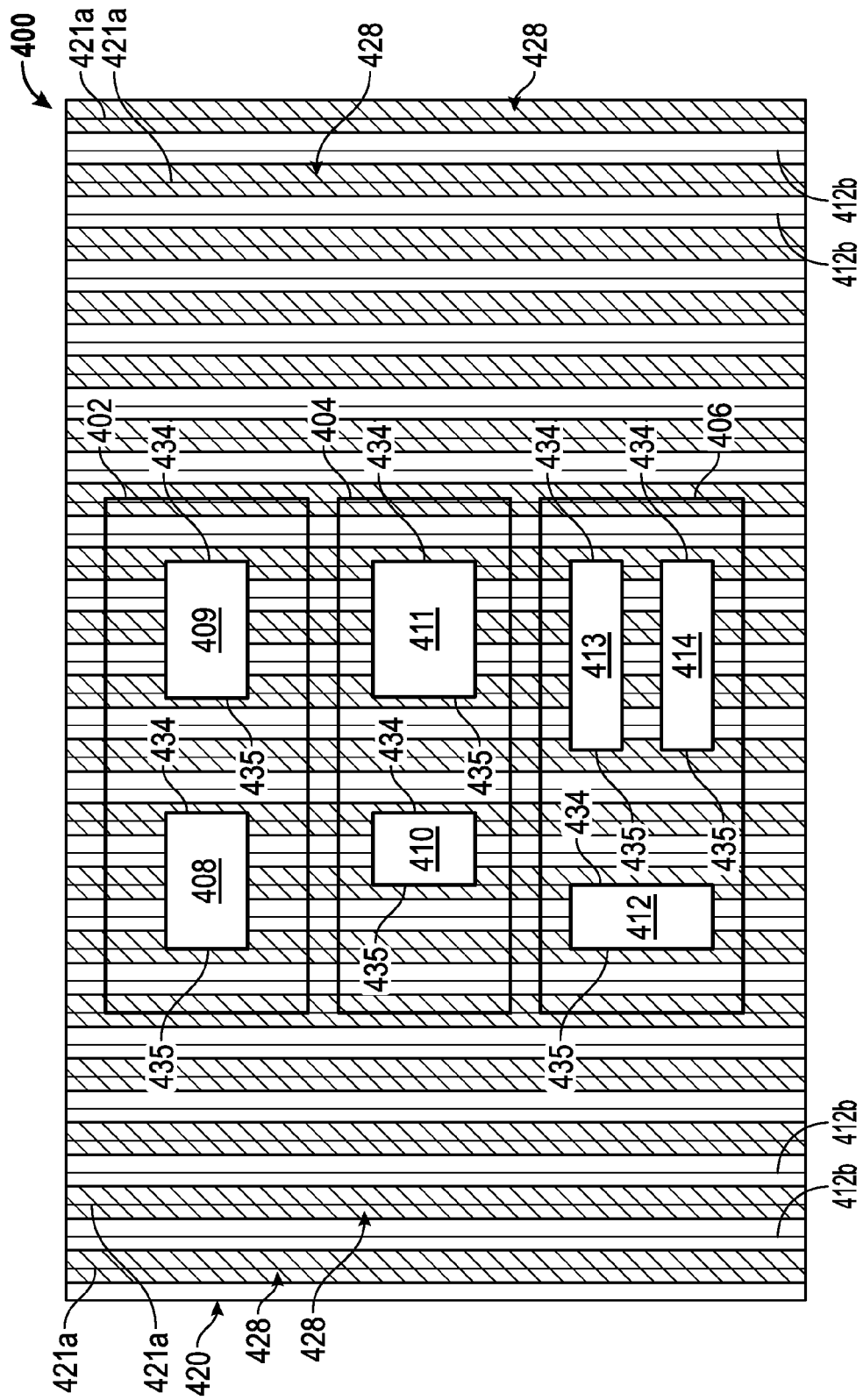

Computer network 101 may be employed to convert a planar integrated circuit design to a non-planar or FinFET integrated circuit design in accordance with the following process steps, which are illustrated in the flowchart shown in FIG. 5, and the exemplary, non-limiting integrated circuit designs shown in FIGS. 4-7. With reference first to FIG. 3, a method 300 for converting the design of a planar integrated circuit to a FinFET integrated circuit begins with a process 302 of superimposing a FinFET grid over a macro cell of a planar integrated circuit design. As shown in FIG. 4, an exemplary macro cell 400 of a planar integrated circuit design is provided having a plurality of rectangularly-shaped RX areas 408-414 disposed therein.

As will be appreciated by those having ordinary skill in the art, a basic logic element, for example, a four-input gate, may be combined with one or more other basic logic elements, and together the various kinds of logic circuits usually employed in integrated circuits may be constructed. For example, an AND gate can be constructed by using two such basic logic elements as described above, and a flip-flop circuit can be constructed by using six such basic cells. A logic circuit which is constructed by using a plurality of basic cells and has a single logic function such as AND, flip-flop, NOR, or EXCLUSIVE OR is called a "macro cell." Each macro-cell can be considered to be a single element in itself, and, for example, when a flip-flop circuit is necessary in the formation of a logic circuit, a previously designed macro cell having the logic function of a flip-flop circuit may be used to form a logic circuit by forming it on the semiconductor chip as a combination of the basic cells by means of the predetermined interconnections.

As noted above, in step 302 of method 300, a FinFET grid 420, having a plurality of equally-spaced parallel grid lines 421, is aligned over the macro cell 400 such that the grid lines 421 are substantially parallel to two sides 432, 433 of each RX area 408-414. A single grid 420 is provided for each macro cell 400 of a planar IC design, and the grid 420 is positioned so as to align with the origin coordinate 425 of the macro cell 400. The grid lines 421 are spaced apart at a spacing 422 in accordance with the design scale of the FinFET integrated circuit to be formed. For example, many FinFET designs employ a 48 nanometer (nm) spacing as spacing 422. In the future, it is expected that smaller spacings, such as 32 nm, 24 nm, etc., may be employed as device sizes are driven continually smaller. The grid 420 is superimposed so as to be parallel with the front-end polysilicon layer orientation of the planar integrated circuit design. As will be appreciated, this orientation, commonly-referred to as the "poly orientation" or "poly gate orientation," refers to the orientation of the primary front-end polysilicon layer used to fabricate the circuit element gates, as may be selected by the IC designer. As each of the areas 408-414 are configured to align with the poly orientation, superimposing the grid 420 so as to align with the poly orientation ensures that the grid lines 421 will be substantially parallel with the two sides 432, 433 of each rectangle that form the areas 408-414.

Thereafter, a plurality (in this example, three) of substantially rectangularly-shaped RX marker areas 402, 404, and 406 are drawn around each RX area 408-414. Each marker area 402, 404, 406 may be drawn so as to encompass one or more of the RX areas 408-414. The RX marker areas 402, 404, 406 are drawn such that two sides 430, 431 of the rectangle are coincident with (i.e., drawn over) two grid lines 421 of the grid 420. As shown in FIG. 4, RX marker area 402 has RX areas 408 and 409 drawn therein, RX marker area 404 has RX areas 410 and 411 drawn therein, and RX marker area 406 has RX areas 412, 413, and 414 drawn therein. Of course, it will be appreciated that the presently described methods are suitable for use with macro cell designs having any number of active silicon areas, with any number of RX marker areas drawn to encompass the active silicon areas. As such, the macro cell 400 illustrated in FIG. 4 is intended as exemplary, not limiting in any way. Further, as shown, the RX marker areas 402, 404, 406 are non-contiguous, meaning that "non-active" portions of the macro cell area 400 are disposed between the marker areas 402, 404, 406, though in other embodiments two or more RX marker areas may be contiguous. Still further, as shown, the RX marker areas 402, 404, and 406 are drawn so as to encompass an area of the macro cell 400 somewhat greater than is need to fully encompass the respective active regions 408-414 in the manner shown, this being done to provide a "buffer area" for the fin structures that will eventually be provided in the RX marker areas 402, 404, 406, as detailed below. However, on other embodiments, the RX marker areas 402, 404, 406 may be drawn coincident with one or more sides of one or more active regions 408-414 therewithin.

As the planar IC designs are usually not designed with consideration for conversion to FinFET designs, it will be appreciated that, as shown in FIG. 4, the two sides 432, 433 of each active silicon area 408-414 will not necessarily be coincident with a grid line 421 (although, as noted above, they will be parallel thereto). Thus, continuing with method 300, process 304 includes re-sizing at least one of the RX areas 408-414 by moving inwardly the two sides 432, 433 thereof that are parallel to grid 420 such that each of the two sides 432, 433 are coincident with (i.e., drawn over) a respective grid line 421 of the grid 420. As shown in FIG. 5, the original shape of each RX area 408-414 is shown in outline having sides 432, 433 parallel to the grid lines 421. Upon resizing by inwardly moving the sides 432, 433 to the nearest inward grid line 421, each RX area 408-414 becomes smaller in width, having re-drawn sides 434, 435 that are drawn overlapping with a respective grid line 421 of the grid 420. As such, each RX area is "cropped" to align with the grid 420. Depending on the initial configuration of each RX area 408-414, each side 432, 433 may or may not require cropping to align with the grid 420. For example, as shown in FIG. 5, side 432 of RX area 410 was already substantially coincident with a grid line 421, and as such the side 432 of RX area 410 was not re-drawn (i.e., lines 432 and 434 thereof are the same). Further, lines 433 of RX areas 408 and 412 did not require re-drawing (i.e., lines 433 and 435 thereof are the same). In contrast, lines 434 of RX areas 409, 411, 412, 413, and 414 are drawn inwardly from lines 432 thereof so as to overlap with a respective grid line 421. Likewise, lines 435 of RX areas 409, 410, 411, 413, and 414 are drawn inwardly form lines 433 thereof so as to overlap with a respective grid line 421. In this manner, the RX areas 408-414 are "gridded" or "snapped" to grid 420. (As previously noted, marker areas 402, 404, 406 were "gridded" to grid 420 by virtue of them being initially drawn thereon.).

Thereafter, the method 300 continues with process 306 of generating fin mandrels along every other grid line of the FinFET grid. For example, referring now to FIG. 6, fin mandrels 428 are generated along the entire length of every other grid line 421a of the FinFET grid 420. The remaining grid lines 421b, which are opposite grid lines 421a, do not have fin mandrels generated thereon. As noted above, the grid lines 421 were equidistantly spaced apart in accordance with the design scale of the FinFET IC (e.g., 48 nm), and as such, in order to provide adequate spacing for each fin drawn to such scale, only every other grid line 421a receives a fin mandrel 428. Each fin mandrel 428 is centered longitudinally (i.e., the direction of the grid lines 421) along the respective grid line 421a to ensure substantially equal spacing between adjacent mandrels 428.

Figure 7:
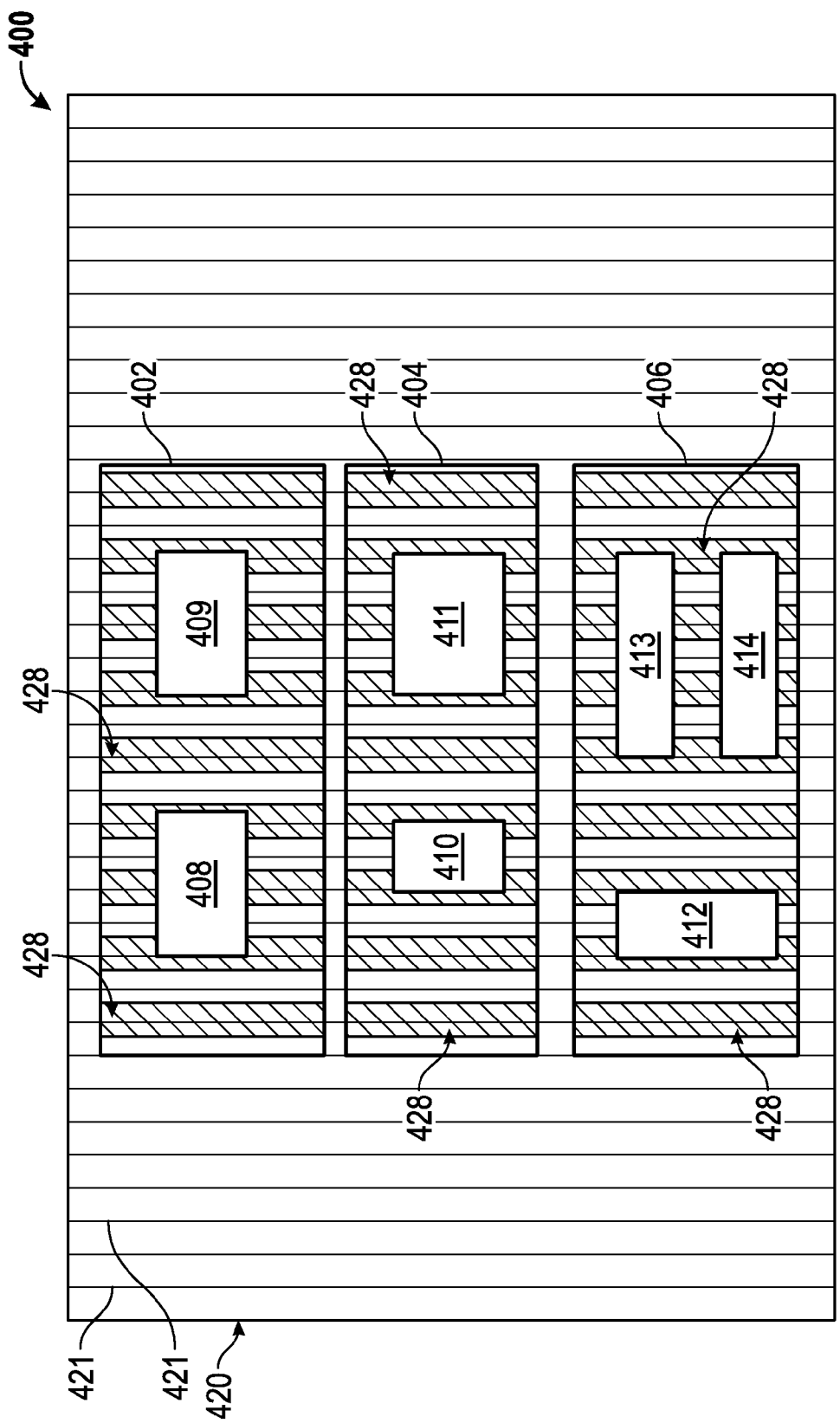

Subsequently, the method 300 continues with process 308 of removing the fin mandrels from areas of the grid 420 that are outside of the RX marker areas 402, 404, and 406. As shown in FIG. 7, mandrels 428 remain drawn within each of RX marker areas 402, 404, and 406, but have been removed from the grid 420 in areas that are outside of the RX marker rectangles. Because, as noted above, the fin mandrels 428 indicate the position of fins to be formed on the FinFET device, and because the fins provide the conductive channel region of the various circuit elements to be formed, fin mandrels 428 need only be formed in and around the active areas 408-414, which are marked by marker areas 402, 404, 406. Thus, it will be appreciated that the initial grouping of the active areas 408-414 within the RX marker areas 402, 404, and 406 determines the areas in which fin structures will be formed on the FinFET IC.

As the above-described process is performed on the macro cell level, as opposed to the reticle level, once conversion has been performed for a given macro cell, it is "merged" back to the overall chip design. Thus, a planar design may be converted to a FinFET design (i.e., "finified" as commonly used in the art) on a macro cell basis, allowing for the targeted verification and analysis of the conversion on a logic unit basis.

Figure 10:
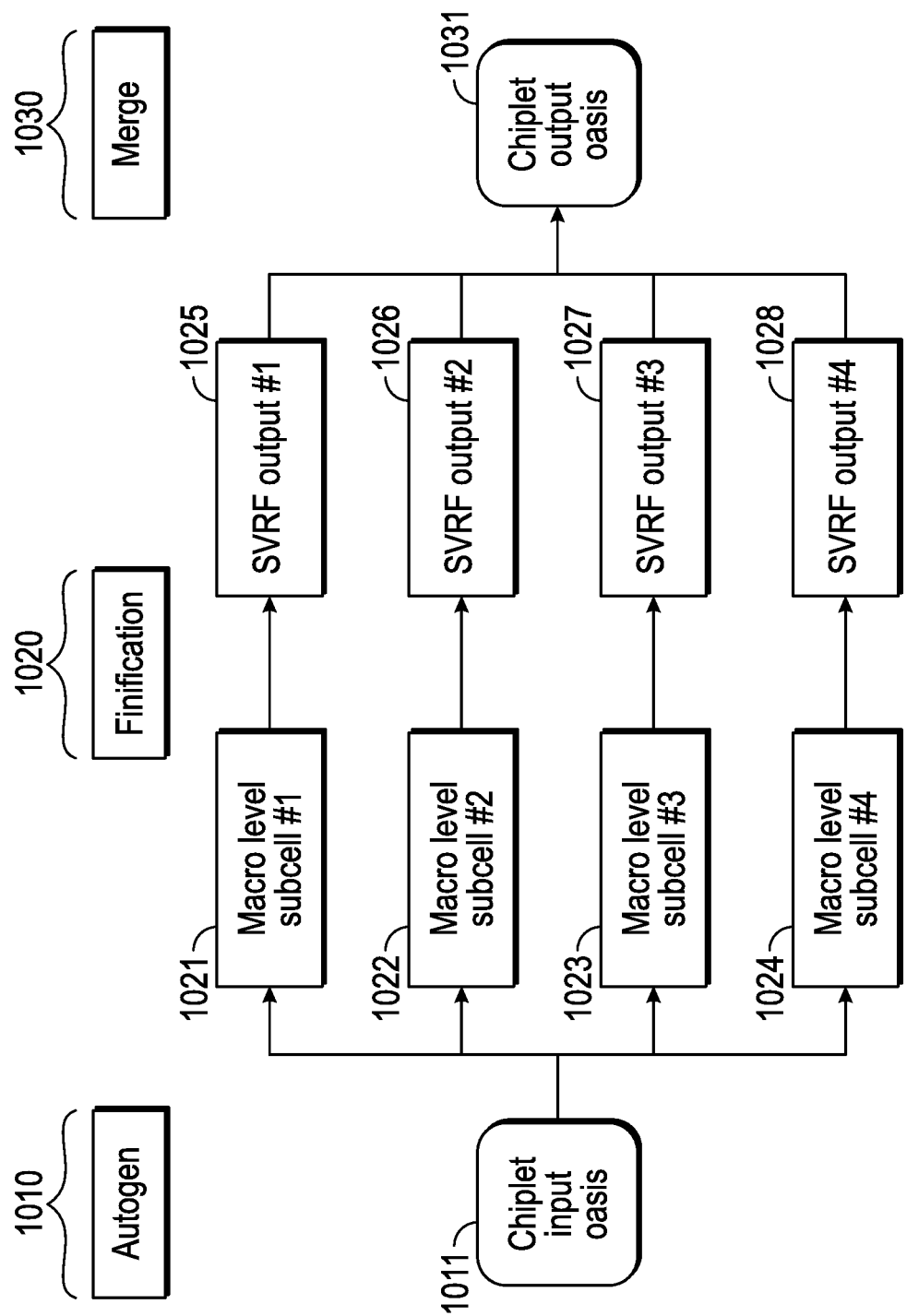
FIG. 10 is a flowchart illustrating various exemplary methods for converting planar designs to FinFET design in accordance with the design shown in FIGS. 4-7.

The conversion of the planar design to a FinFET design, as in FIGS. 4-7, is further illustrated in connection with FIG. 10. FIG. 10 illustrates a computer-implemented method (such as may be implemented using the computing system shown in FIGS. 1-2) in accordance with various embodiments. As shown therein, an automatic generation ("autogen") phase 1010 includes the step 1011 of inputting a planar chiplet design into the computing system and retrieving the design feature boundary and coordinate information. Thereafter, at the finification phase 1020, the planar chiplet design is separated into a plurality (four illustrated in FIG. 10) of macro level cells ("subcells"), as shown at steps 1021, 1022, 1023, and 1024. Each of the plurality of macro level subcells 1021-1024 are subjected to the finification process illustrated and described above with regard to FIGS. 4-7 using the boundary information retrieved during the phase 1010, which is referred to as standard verification rule formatting ("SVRF"), as shown in steps 1025, 1026, 1027, and 1028, respectively. Thereafter, as noted above, in a merge phase 1030 of the process, each of the converted macro cells are merged back to the chiplet design, which is now in a FinFET format by using the coordinate information retrieved during the phase 1010, as shown at step 1031.

Thereafter, with the planar design now converted to a FinFET design, embodiments of the present disclosure may be used to design logical IC chips capable of being fabricated using processes and apparatus known in the art. For example, once a layout design has been redesigned and finalized according to the methodology described above, the fabrication process can be accomplished by providing the FinFET design to a semiconductor fabrication facility, which uses the design to fabricate a plurality of lithography masks (i.e., a "mask set") to fabricate the FinFET semiconductor device by implementing the logical design in and on a semiconductor substrate.

Figure 8:
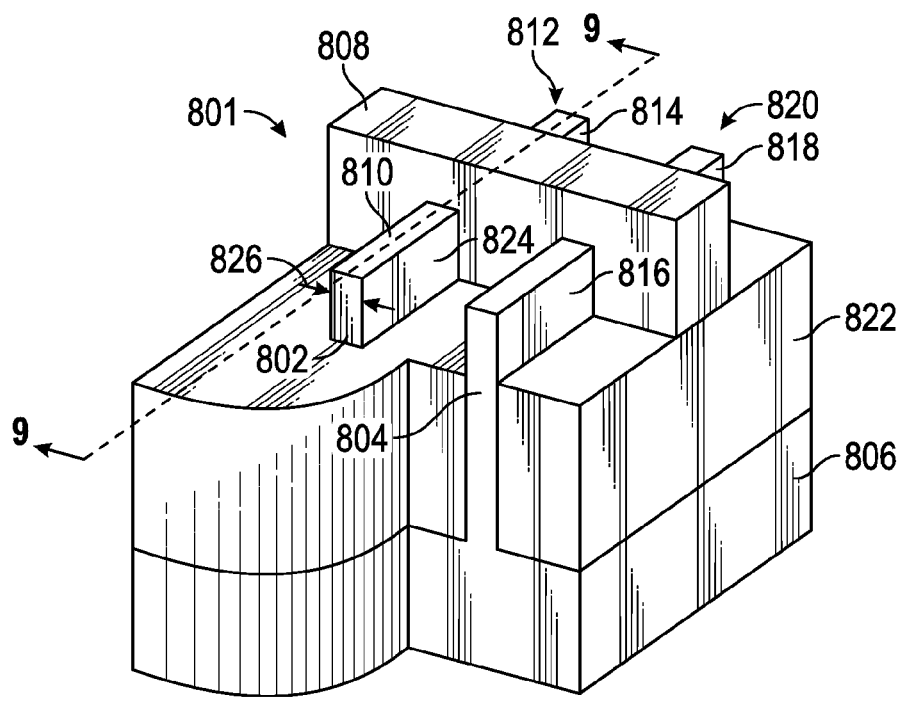
FIG. 8 illustrates, in a cut away perspective view, a portion of a FinFET integrated circuit fabricated in accordance with the design shown in FIGS. 4-7.
Figure 9:
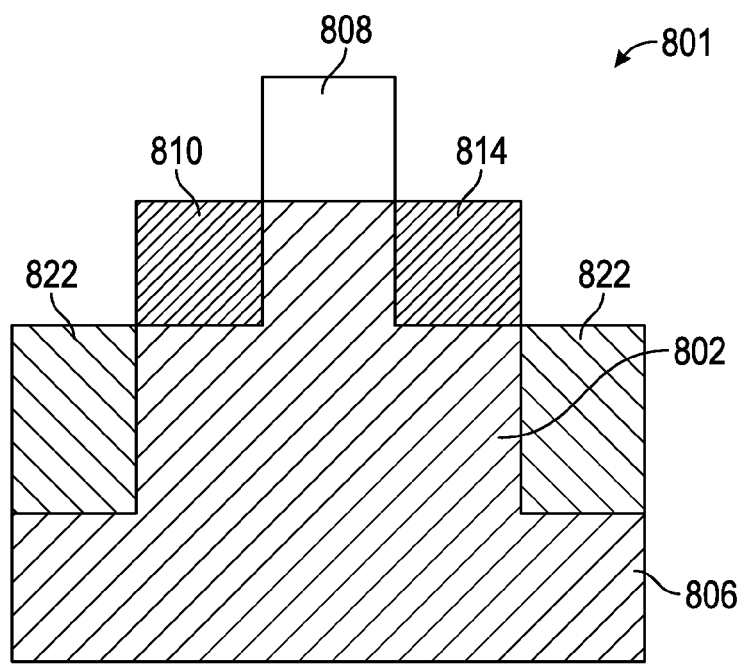
FIG. 9 illustrates, in cross section, a portion of the FinFET integrated circuit of FIG. 8.

Adverting to FIGS. 8 and 9, the FinFET designs generated in accordance with the foregoing planar-to-FinFET design conversion methods may be input to a suitable integrated circuit fabrication process for fabricating an integrated circuit in accordance with the FinFET designs. For example, FIG. 8 illustrates, in a cut away perspective view, a portion of a FinFET integrated circuit (IC) 801 that may be generated from a FinFET layout design converted from a planar design in accordance with FIGS. 4-7, above. The illustrated portion of IC 801 includes two fins 802 and 804 that are formed from and extend upwardly from a bulk semiconductor substrate 806. A gate electrode 808 overlies the two fins and is electrically insulated from the fins by a gate insulator (not illustrated). End 810 of fin 802 is appropriately impurity doped to form the source of a field effect transistor 812 and end 814 of that fin is appropriately impurity doped to form the drain of the FET. Similarly, ends 816 and 818 of fin 804 form the source and drain, respectively, of another FET 820. The illustrated portion of IC 801 thus includes two FETs 812 and 820 having a common gate electrode. In another configuration, if sources 810 and 816 are electrically coupled together and drains 814 and 818 are electrically coupled together the structure would be a two-fin FinFET having twice the gate width of either FET 812 or 820. Oxide layer 822 forms electrical isolation between fins and between adjacent devices as is needed for the circuit being implemented. The channel of FinFET 812 extends along the sidewall 824 of fin 802 beneath gate electrode 808 as well as along the opposite sidewall not visible in this perspective view. The advantage of the FinFET structure is that although the fin has only the narrow width represented by the arrows 826 (i.e., in accordance with the scale of the grid 420), the channel has a width represented by at least twice the height of the fin above oxide 822. The channel width thus can be much greater than fin width.

The FinFET IC 801 illustrated in FIGS. 8 and 9 may be fabricated, based on the converted layout design described above, in accordance with well-known fabrication techniques. Regarding the fabrication methods that may be employed to generate a FinFET integrated circuit in accordance with the presently described design methods, in one exemplary method, bulk silicon (806) on a substrate is etched into a rectangular fin shape (802, 804) by first patterning and depositing a hardmask layer on the bulk silicon (806) in accordance with a FinFET design, such as the one shown in FIG. 7, using one or more optical photomasks generated in accordance with the FinFET design. The hardmask forms a pattern covering the top of the fins (802, 804). The bulk silicon (806) is then etched to form trenches between the regions covered by the hardmask layer. The trenches are formed into shallow trench isolation (STI) features by depositing a dielectric material, usually silicon oxide (822), into the trench. The dielectric material is usually deposited in excess to completely cover the fins (802, 804) and optionally the hardmask layer if not already removed. The dielectric material (822) is planarized down to the top surface of the fin/hardmask, and then etched to a level below the top of the fin (802, 804) so that a portion of the fin protrudes above the STI.

In a variation of this method, the hardmask for etching in to the bulk silicon is formed by a process using mandrels (428). A photoresist pattern is formed and used to etch a mandrel pattern (428). A conformal spacer material is then deposited around the mandrel (428). The conformal spacer is usually formed of a hardmask material forming a spacer sidewall thinner than that of the mandrel (428). The mandrel (428) material between the spacers is then removed in subsequent etching operations to leave just the spacers behind. Some of the spacers are then used as a hardmask for etching the silicon layers below, forming the fin structures (802, 804). Methods to convert planar structure layouts to FinFET structure layouts in accordance with various embodiments of the present disclosure use the method variation with mandrels (428), although other methods may be used, such as the first method not using mandrels. A gate electrode 808 is formed in a conventional manner, for example by depositing and patterning a conductive gate electrode material, such as a silicon-based material or a metal-based material, overlying the fin structures (802, 804)

Although not illustrated in FIG. 8 or 9, the FinFET integrated circuit 801 is completed in a conventional manner by, for example, providing electrical contacts to the source and drain regions 810, 814, 816, and 818 and to the gate electrode 808. This conventional processing may include, for example, depositing interlayer dielectrics, etching contact vias, filling the contact vias with conductive plugs, and the like as are well known to those of skill in the art of fabricating integrated circuits. Additional post-processing may include the formation of one or more metal layers (M1, M2, etc.) and interlayer dielectric layers therebetween to complete the various electrical connections in the integrated circuit. The present disclosure is not intended to exclude such further processing steps as are necessary to complete the fabrication of the functional integrated circuit.

Accordingly, various exemplary embodiments have been disclosed for converting planar designs to FinFET designs in the design and fabrication of integrated circuits. In accordance with the disclosed embodiments, conversion of the planar design can be performed at the macro cell level, as opposed to the reticle level, thus allowing verification of the design early on in the design process flow, and significantly reducing the amount of data needed to be processed for verification. Further, the methods allow for the analysis of targeted macro cells, as opposed to a top level review of the circuit design at the reticle level. Overall design cost and time may thus be reduced. Further, the reliability of the designs, and thus the yields of ICs fabricated thereby, may be increased.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the disclosure as set forth in the appended claims and their legal equivalents.

What is claimed is:

1. A method for converting a planar integrated circuit design to a non-planar integrated circuit design comprising:
   identifying, using a computer processor of a computing system, a rectangular silicon active area in the planar integrated circuit design;
   superimposing, using the computer processor, a FinFET design grid comprising a plurality of equidistantly-spaced parallel grid lines over the rectangular silicon active area such that two sides of the rectangular silicon active area are parallel to the grid lines;
   generating, using the computer processor, a rectangular active silicon marker area encompassing the silicon active area;
   generating, using the computer processor, fin mandrels longitudinally along every other grid line of the plurality of grid lines and within the active silicon marker area and the silicon active area; and
   removing, using the computer processor, a portion of the fin mandrels from the design grid so as to generate the non-planar integrated circuit design, wherein removing the portion of the fin mandrels from the design grid comprises removing the fin mandrels from areas of the design grid outside of the active silicon marker area.

2. The method of claim 1, wherein identifying the rectangular silicon active area comprises identifying a plurality of rectangular silicon active areas.

3. The method of claim 2, wherein generating the rectangular active silicon marker area comprises generating the rectangular active silicon marker area encompassing each rectangular silicon active area of the plurality of rectangular silicon active areas.

4. The method of claim 3, wherein generating the rectangular active silicon marker area comprises generating a plurality of rectangular active silicon marker areas, each rectangular active silicon marker area of the plurality of rectangular active silicon marker areas encompassing at least two rectangular silicon active areas of the plurality of rectangular silicon active areas.

5. The method of claim 4, wherein an area defined by an active silicon marker area of the plurality of active silicon marker areas is greater than an area defined by a combination of areas of each silicon active area of the plurality of silicon active areas within the active silicon marker.

6. The method of claim 1, wherein generating the rectangular active silicon marker area comprises generating the rectangular active silicon marker area such that two sides thereof are coincident with two respective grid lines of the plurality of grid lines.

7. The method of claim 6, wherein superimposing the FinFET design grid comprises superimposing the FinFET design grid such that at least one of the two sides of the rectangular silicon active area that are parallel to the grid lines is not coincident with any grid line of the plurality of grid lines.

8. The method of claim 7, further comprising re-sizing the rectangular silicon active area by inwardly moving the at least one of the two side of the rectangular silicon active area so as to coincide with a nearest inward grid line of the plurality of grid lines.

9. The method of claim 6, wherein superimposing the FinFET design grid comprises superimposing the FinFET design grid such that both of the two side of the rectangular silicon active area that are parallel to the grid lines are not coincident with any of grid line of the plurality of grid lines.

10. The method of claim 9, further comprising re-sizing the rectangular silicon active area by inwardly moving both of the two sides of the rectangular silicon active area so as to coincide with respective nearest inward grid lines of the plurality of grid lines.

11. The method of claim 1, wherein generating fin mandrels comprises generating fin mandrels that are longitudinally-centered on respective grid lines of the plurality of grid lines.

12. The method of claim 1, wherein identifying the rectangular silicon active area comprises identifying the rectangular silicon active area of a single macro cell.

13. The method of claim 12, wherein superimposing the FinFET design grid comprises superimposing the FinFET design grid oriented on an origin of the single macro cell.

14. The method of claim 13, wherein superimposing the FinFET design grid comprises superimposing the FinFET design grid so as to overlie only the single macro cell.

15. The method of claim 14, wherein generating the non-planar design comprises generating a non-planar design for the single macro cell, and further comprising merging the non-planar design with a further non-planar design to generate a reticle-level non-planar design.

16. A method for fabricating an integrated circuit comprising:
   identifying a rectangular silicon active area in the planar integrated circuit design;
   superimposing a FinFET design grid comprising a plurality of equidistantly-spaced parallel grid lines over the rectangular silicon active area such that two sides of the rectangular silicon active area are parallel to the grid lines;
   generating a rectangular active silicon marker area encompassing the silicon active area;
   generating fin mandrels longitudinally along every other grid line of the plurality of grid lines and within the active silicon marker area and the silicon active area; and
   removing a portion of the fin mandrels from the design grid so as to generate the non-planar integrated circuit design, wherein removing the portion of the fin mandrels from the design grid comprises removing the fin mandrels from areas of the design grid outside of the active silicon marker area;
   generating a photolithographic mask based on the non-planar integrated circuit design; and
   forming a non-planar integrated circuit in a semiconductor substrate by exposing a light source through the photolithographic mask and onto the semiconductor substrate.

17. The method of claim 16, further comprising depositing a photoresist material onto the semiconductor substrate prior to exposing the semiconductor substrate to the light source.

18. The method of claim 16, wherein generating a photolithographic mask comprises generating a plurality of photolithographic masks comprising a photolithographic mask set, and further comprising exposing the semiconductor substrate to the light source through each photolithographic mask of the photolithographic mask set.

19. A computer program product, comprising:
   a first set of instructions, stored in at least one non-transitory machine-readable medium, executable by at least one processing unit to identify a rectangular silicon active area in the planar integrated circuit design;
   a second set of instructions, stored in the at least one non-transitory machine-readable medium, executable by the at least one processing unit to superimpose a FinFET design grid comprising a plurality of equidistantly-spaced parallel grid lines over the rectangular silicon active area such that two sides of the rectangular silicon active area are parallel to the grid lines;
   a third set of instructions, stored in the at least one non-transitory machine-readable medium, executable by the at least one processing unit to generate a rectangular active silicon marker area encompassing the silicon active area;
   a fourth set of instructions, stored in the at least one non-transitory machine-readable medium, executable by the at least one processing unit to generate fin mandrels longitudinally along every other grid line of the plurality of grid lines and within the active silicon marker area and the silicon active area; and
   a fifth set of instructions, stored in the at least one non-transitory machine-readable medium, executable by the at least one processing unit to remove a portion of the fin mandrels from the design grid so as to generate the non-planar integrated circuit design, wherein the fifth set of instructions comprises instructions to remove the fin mandrels from areas of the design grid outside of the active silicon marker area.

\* \* \* \* \*